(12) United States Patent
Tazartes et al.

(10) Patent No.: US 6,360,602 B1
(45) Date of Patent: Mar. 26, 2002

(54) METHOD AND APPARATUS REDUCING OUTPUT NOISE IN A DIGITALLY REBALANCED ACCELEROMETER

(75) Inventors: Daniel A. Tazartes, West Hills; Yumi Yoshida, Glendale; John G. Mark, Pasadena, all of CA (US)

(73) Assignee: Litton Systems, Inc., Woodland Hills, CA (US)

( * ) Notice: Subject to any disclaimer, the term of this patent is extended or adjusted under 35 U.S.C. 154(b) by 0 days.

(21) Appl. No.: 09/362,969

(22) Filed: Jul. 29, 1999

(51) Int. Cl.[7] .............................................. G01P 15/13
(52) U.S. Cl. .................................... 73/514.18; 73/1.38
(58) Field of Search ......................... 73/514.17, 514.18, 73/514.32, 514.21, 514.23, 514.24, 514.36, 514.37, 514.38, 1.38; 361/280, 283.3

(56) References Cited

U.S. PATENT DOCUMENTS

| | | | | |
|---|---|---|---|---|
| 3,248,559 A | * | 4/1966 | Azar ........................ | 73/514.18 |
| 3,722,293 A | * | 3/1973 | Morris ..................... | 73/514.17 |
| 4,584,885 A | * | 4/1986 | Cadwell ................... | 73/514.18 |
| 4,764,748 A | | 8/1988 | Geen et al. ................ | 340/347 |
| 5,142,921 A | | 9/1992 | Stewart et al. ............. | 73/868.1 |
| 5,277,053 A | * | 1/1994 | McLane et al. ............. | 73/1.38 |
| 5,485,273 A | | 1/1996 | Mark et al. ................ | 356/350 |
| 5,604,308 A | * | 2/1997 | Mark et al. ............... | 73/514.17 |
| 5,612,494 A | * | 3/1997 | Shibano .................... | 73/514.18 |

FOREIGN PATENT DOCUMENTS

EP 0385917 9/1990

* cited by examiner

*Primary Examiner*—Helen Kwok
(74) *Attorney, Agent, or Firm*—Elliott N. Kramsky

(57) ABSTRACT

A closed loop accelerometer includes apparatus within an associated digital rebalance loop for reducing the presence of low frequency moding noise in the accelerometer output. In one embodiment, the digitized corrective signal is applied to a moving average filter. In a second embodiment, the corrective signal is modulated with a random function and, in a third embodiment, the digitized corrective signal is both randomized and applied to a moving average filter. In each embodiment, the periodic moding noise that results from the analog-to-digital conversion within the rebalance loop is significantly reduced from that observed in prior art systems.

18 Claims, 8 Drawing Sheets

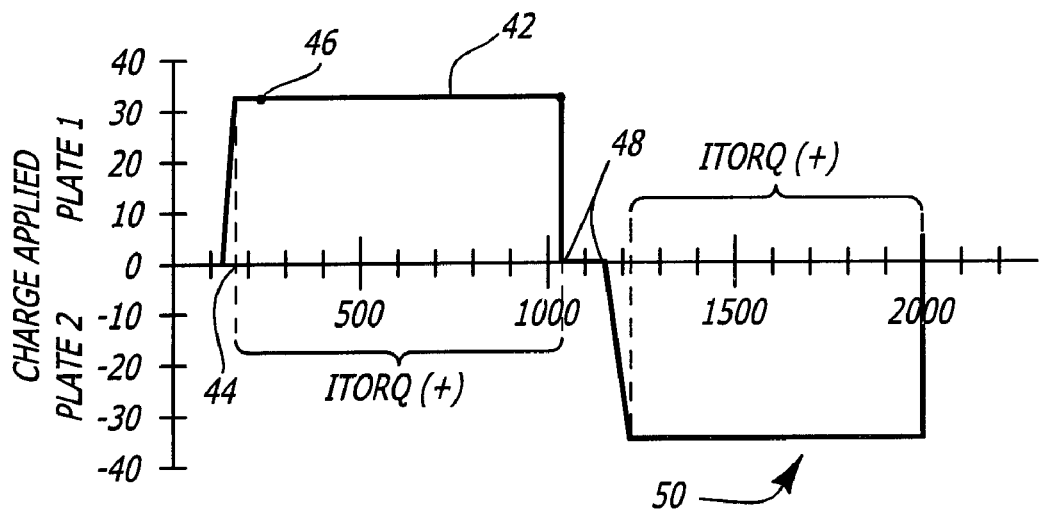
FIG. 2 (PRIOR ART)   $ITORQ = ITORQ(+) - (ITORQ(-))$
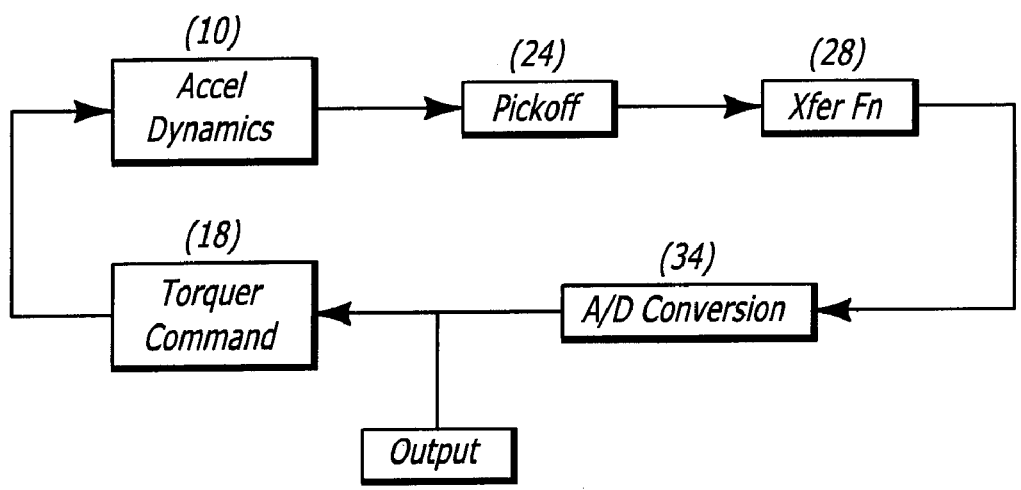
FIG. 3 (PRIOR ART)

5000 CYCLES/SEC

METHOD AND APPARATUS REDUCING OUTPUT NOISE IN A DIGITALLY REBALANCED ACCELEROMETER

BACKGROUND

1. Field of the Invention

The present invention relates to apparatus and methods for improving the quality of the acceleration data output of a closed-loop accelerometer. More particularly, this invention pertains to a method and apparatus for reducing moding in the output of a digitally rebalanced accelerometer.

2. Description of the Prior Art

Many accelerometers include a pendulous proofmass for sensing acceleration relative to inertial space. Motion of the proofmass relative to the body of the accelerometer (and the attached object) is induced by acceleration and the displacement of the proofmass provides a measure of the acceleration force.

The displacement-versus-acceleration characteristic of an accelerometer is highly nonlinear. Such nonlinearity may be due to a number of factors. For example, in a silicon accelerometer that employs a hinged floating element between a pair of conductive plates, an inverse square relationship governs the force exerted upon the pendulous mass as it travels through the gap between the charged conductive plates. Nonlinearities may also be introduced through the bending characteristics of the hinges that attach the pendulous mass to the frame. Such second order effects can produce a nonlinear stiffness response in the bent hinge as the pendulous mass is deflected through the gap.

In order to improve the accuracy of such accelerometers, they are often configured to operate in a closed-loop fashion. The force then required to maintain the null position of the pendulous mass, rather than its displacement, provides the measure of acceleration. A rebalance loop is employed for this purpose and many rebalance techniques are available. Generally, the most effective techniques employ a modulation and forcing process that takes place at a specific frequency. The output of the accelerometer may be represented by a digital value that is equal to the duty cycle of the voltage rebalance waveform in voltage rebalance schemes. Alternatively, the digital value may represent the number of charge quanta applied in charge rebalance schemes. Closed loop accelerometers of the above-identified type are illustrated, for example, in U.S. Pat. No. 4,679,434 entitled "Integrated Force Balanced Accelerometer" and U.S. Pat. No. 5,142,921 entitled "Force Balance Instrument With Electrostatic Charge Control" of Robert E. Stewart et al. They include a pendulous mass and a pair of electrostatic plates or electrodes positioned close to, but slightly spaced from and on opposite sides of the mass that act as both pickoffs and forcers. The mass is cantilevered from a surrounding frame by hinges to deflect about an output axis in response to acceleration along a predetermined input axis.

Force rebalance control of the position of the mass is achieved by controlling the charge on the capacitor plates. The devices are operated by repetitively applying a constant attractive force that acts alternately on opposed sides of the sensing mass with the fixed force applied to one or the other side for varying intervals. The relative lengths of successive intervals are determined by the magnitude of the acceleration detected by the hinged mass.

The relative lengths of the successive intervals or part cycles of force application are controlled by varying the duty cycle of a periodic wave (e.g. a square wave). For example, when the duty cycle is fifty percent, equal and opposite forces are applied to the pendulum for equal periods of time and the resultant force on the sensing mass is zero. The difference in duration between the two portions of a single cycle, ITORQ, is a linear measure of acceleration.

In a rebalanced system such as that described above, it is often advantageous to convert the measure of acceleration (i.e. the differential duration of time for returning the mass 10 to null, ITORQ) to digital form prior to application to the electrodes acting as torquers.

The digital value could be, for example, the number of charge quanta applied to the electrodes. Since the force required to null the proofmass provides accelerometer output, the value of acceleration comprises a stream of pulses with the average amplitude over a number of force rebalance cycles being the measure of acceleration.

Should the acceleration over a given number of force rebalance cycles include a fractional value, this will be expressed, in a digitized format, by sequences of digital words that comprise integer values which, averaged together, express the correct fractional amount. It has been observed that the resultant sequences of digitized values can contain low-frequency, non-random patterns known as "moding noise". The often arbitrarily-low frequencies of such patterns within output data complicate its interpretation, analysis and reliability.

SUMMARY OF THE INVENTION

The preceding and other problems of the prior art are addressed by the present invention that provides, in a first aspect, a method for reducing periodic low frequency noise in the output of a closed-loop force rebalanced accelerometer of the type in which a quantized digital signal is used as a nulling signal for torquing a pendulous mass. The digital signal is also used to provide a measure of an input quantity such as acceleration. Such method is begun by receiving the digitized output. Thereafter, the digitized output signal is processed using methods that will alternate low frequency patterns resulting from the quantization while preserving true low frequency information.

In a second aspect, the invention provides a method for reducing periodic low frequency noise in the output of a closed-loop force rebalanced accelerometer of the type in which a digital output signal for torquing a pendulous mass is derived from an analog nulling signal. Such method is begun by adding analog noise to the nulling signal. Thereafter, the resultant signal is digitized to form the output signal.

In a third aspect, the invention provides a method for reducing periodic low frequency noise in the output of a closed-loop force rebalanced accelerometer of the type in which an analog nulling signal is digitized to form a signal that is fed back within the closed loop. Such method comprises the step of randomizing the digitized signal to form the output.

In a fourth aspect, the invention provides a closed-loop force rebalanced accelerometer. Such accelerometer includes a pendulous mass. A pickoff circuit generates an analog signal responsive to displacement of the mass. A transfer function circuit generates an analog nulling signal. An analog-to-digital conversion circuit is provided for digitizing the nulling signal. A torquer circuit is provided for driving the pendulous mass in response to the digitized nulling signal. A filter, located outside the closed loop, receives the digitized nulling signal and generates an output in response.

In a fifth aspect, the invention provides a closed-loop force rebalanced accelerometer that includes a pendulous mass, a pickoff circuit for generating an analog signal in response to displacement of the mass, a transfer function circuit for generating an analog nulling signal in response to the pickoff signal, an analog-to-digital conversion circuit for digitizing the nulling signal and a torquer circuit for driving the pendulous mass in response to the digitized nulling signal. A circuit is additionally provided within the loop for adding analog noise to the nulling signal whereby the nulling signal including analog noise is digitized by the analog-to-digital conversion circuit.

Finally, in a sixth aspect, the invention provides a closed-loop force rebalanced accelerometer generally as above. However, rather then providing apparatus for adding analog noise, in this aspect a circuit is provided for randomizing the nulling signal.

The foregoing and other features and advantages of this invention will become apparent from the detailed description that follows. Such detailed description is accompanied by a set of drawing figures. Numerals of the drawing figures, corresponding to those of the written description, point to the features of the invention with like numerals referring to like features throughout both the drawing figures and the written text.

BRIEF DESCRIPTION OF THE DRAWINGS

FIG. 2 is a waveform for illustrating the force rebalance cycle of a closed loop accelerometer such as that of FIG. 1;

FIG. 3 is an operational model of the closed-loop digitally-rebalanced accelerometer of FIG. 1;

DETAILED DESCRIPTION OF THE PREFERRED EMBODIMENT

The invention provides both a method and apparatus for reducing moding noise in the output of a digitally-rebalanced accelerometer. The utility of the invention is illustrated below, in pertinent part, through observation of simulations of operational models thereof and comparison thereof with apparatus in accordance with the prior art. A detailed disclosure of the operation of a prior art force rebalanced accelerometer with digitization of output data will follow to illustrate a basic "platform" of the invention. Thereafter, an operation model is shown and the results of a simulation thereof disclosed. This is followed by the disclosure of the invention in the form of operational models thereof. The performance or utility of each embodiment of the invention is illustrated in the form of output data derived from simulations of the operational models. The precise means for implementing the physical changes to a representative prior art platform as illustrated in FIG. 1 to achieve devices that perform in accordance with the operational models of the invention will be apparent to one skilled in the art.

Figure 1:
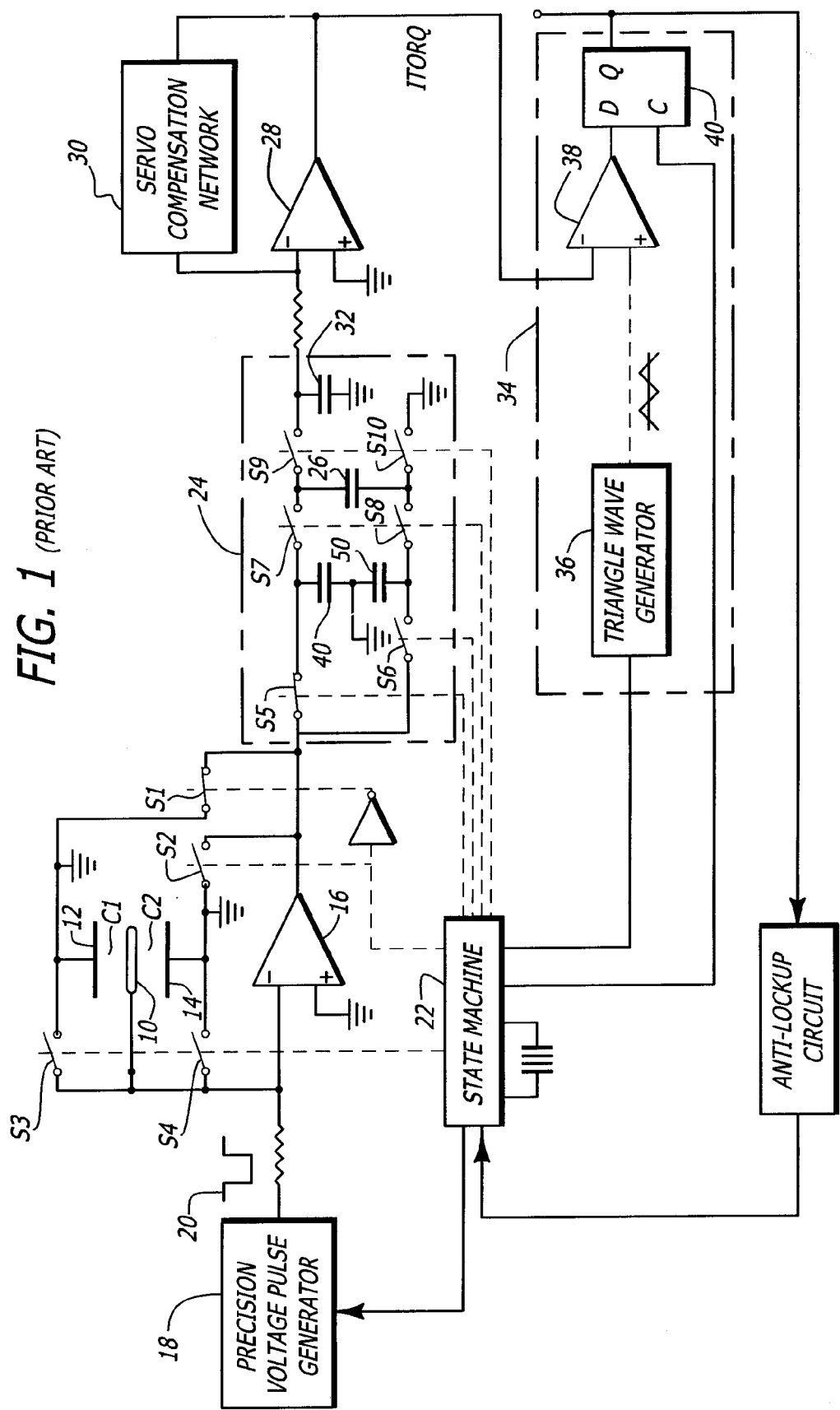
FIG. 1 is a schematic diagram of a representative closed-loop accelerometer in accordance with the prior art as illustrated in U.S. Pat. No. 5,142,921.

FIG. 1 is a schematic diagram of a representative force rebalanced accelerometer. In particular, the device of FIG. 1 is based upon that taught by U.S. Pat. No. 5,142,921, property of the Assignee herein. As shown, plates 12, 14, in conjunction with a mass 10, form capacitors C1 and C2 that are connected in two parallel feedback paths of an operational amplifier 16 that acts as a charge integrator. Switches S1 and S2 define feedback paths that include the capacitors C1 and C2 respectively while discharge or reset switches S3 and S4 allow momentary discharging of the capacitors C1 and C2 just prior to charging.

A precision voltage pulse generator 18 includes a voltage reference that feeds a voltage pulse 20 of precisely controlled duration to the input of the amplifier 16 when one or the other of switches S1 and S2 is closed. The switches S1 and S2 are alternately closed by timing signals from a state machine 22. The timing control of the switches S1 through S4 (as well as switches S5 through S10 of a differential sample and hold circuit 24 by the state machine 22 is indicated by various broken lines of FIG. 1.

The differential sample and hold circuit 24 alternately samples and stores the voltages on plates 12 and 14 in a first sampler stage and transfers pairs of samples to a different stage. The second stage of the sampler performs a differencing function. The voltage on a capacitor 26 indicates the deviation of the pendulum 10 from the centerline between the electrode plates, a signal that is eventually input to an integrator stage 28 with an associated servo compensation circuit 30.

The application of the precision pulse 20 to the integrator 16 causes a known current flow of precise duration. Such pulse alternately establishes a charge on each of the plates 12 and 14. This causes a plate to remain at a voltage that is predetermined by the quantity of the injected charge and the capacitance existing between it and the mass 10. The charge injected upon each plate remains constant from cycle to cycle. Thus, the voltage of a capacitor is solely a function of the accelerometer plate capacitance (which, in turn, varies as the pendulous mass 10 is displaced) with the voltage on each capacitor C1 and C2 being a function of the displacement of the accelerometer sensing mass. Charge is applied to a single plate at a time. The plate voltages are sampled, then differenced (between the sampled voltages) to provide a pick-off signal.

The difference signal is fed from a capacitor 32 to the amplifier 28 which outputs an analog signal that represents the force required to maintain the pendulous mass 10 at null. This signal is fed to a pulse width modulation circuit 34 that generates a square wave whose duty cycle is varied in accordance with the analog signal from the amplifier 28. Pulse-width modulation circuit 34 may include a triangle wave generator 36 whose output is compared with the analog signal from the amplifier integrator 28 in a comparator formed by an operational amplifier 38 that receives a triangle wave and analog pick-off signal at its non-inverting and inverting inputs respectively. The comparator 38 triggers a flip flop 40 which is clocked, for example, by a 2.5 MHz clock signal from the state machine 22. The output of the flip flop 40 provides a pulse width modulated signal that is effectively quantized by the clock output of the state machine. As explained, for example, in the referenced patent, such output is timed to provide a rebalance duty cycle, responsive to the pick-off signal, for nulling the position of the proofmass 10 with respect to the plates 12 and 14. Alternatively, pulse-width modulation circuit 34 could be replaced by a sampling analog to digital converter (A/D).

The rebalance cycle of a force rebalanced accelerometer of the type illustrated in FIG. 1 is shown in FIG. 2. The rebalance cycle for torquing the pendulum of the accelerometer is defined by an upper or first plate charging subcycle 42 that includes an initial delay 44 followed by a period of time ITORQ(+) during which a quantity of charge (sampled at 46) is applied for a predetermined period of time ITORQ (+) to the upper plate. This is terminated at 48 by discharge of the plate electrode and a similar charging cycle is begun (at 50) by applying charge to the lower or second plate. As discussed above, in a closed-loop system the net rebalance force ITORQ (=ITORQ(+)−ITORQ(−)) constitutes the measure of acceleration.

The simulations of prior art systems and those in accordance with the invention are based upon a silicon accelerometer generally in accordance with a heavily damped, lightly weighted pendulum that is stabilized to a null (upright) position by plates that are successively charged to attract the pendulum back to the null position. In such a system, a torquing charge is determined by sampling and holding the charge at two points within a presumed 5 kHz cycle as illustrated in FIG. 2. As mentioned above, the rebalance dynamics employs the sampled values to determine the duration (ITORQ) of the torquing charge. ITORQ is obtained from an analog-to-digital value (A/D conversion) and looped back. As mentioned earlier, quantization error in the output occurs as a result of the conversion from an analog to a digital signal.

FIG. 3 is an operational model of the closed-loop digitally-rebalanced accelerometer of FIG. 1. Numerals in parentheses adjacent blocks of this figure associate apparatus of FIG. 1 with the model. That is, the response of the position of the pendulous mass 10 provides the accelerometer's dynamics; the differential sample-and-hold circuit 24 provides the pickoff function; the integrator stage 28 provides the transfer function for generating ITORQ; and the pulse width modulation circuit 34 converts ITORQ to a digital value. Various modifications of the representative apparatus of FIG. 1 to correspond to operational models of the various embodiments of the invention will be apparent to those skilled in the art.

Figure 4A:
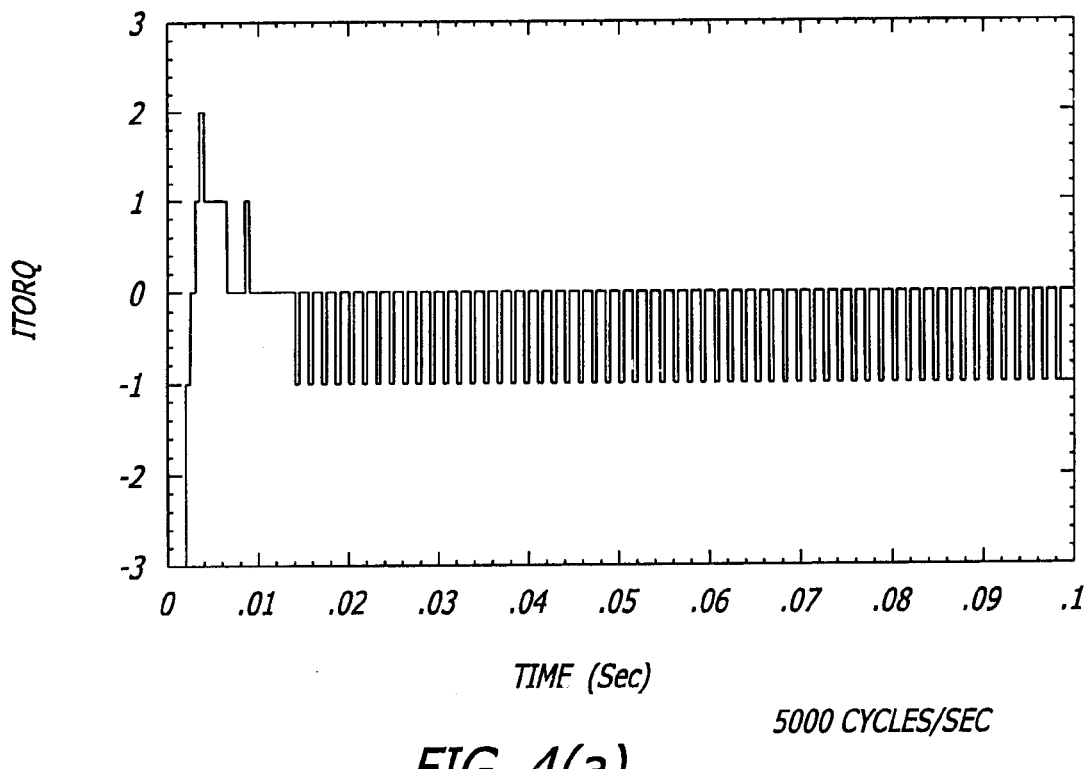
FIGS. 4(a) and 4(b) are time and frequency domain graphs, respectively, for illustrating the output of a simulation based upon the operational model of FIG. 3.

FIG. 4(a) is a time domain graph of the output of a simulation based upon the operational model of a prior art force-rebalanced accelerometer. The illustrated data was generated for response to an acceleration force of 0.00825 g. Such a small value of acceleration facilitates observation of the moding phenomenon as it requires that a small fractional value be derived from the averaging of successive integer values. The data was collected at 5 kHz, the presumed cycle frequency of the accelerometer. As 0.1 seconds of time are illustrated in FIG. 4(a), the graph presents 500 force rebalance cycles (or time slices).

Observing the graph of FIG. 4(a), it can be seen that, after an initial transient response, the values of ITORQ vary periodically between "−1" and "0". This represents a clear low frequency periodic or moding pattern resulting from quantization.

Figure 4B:
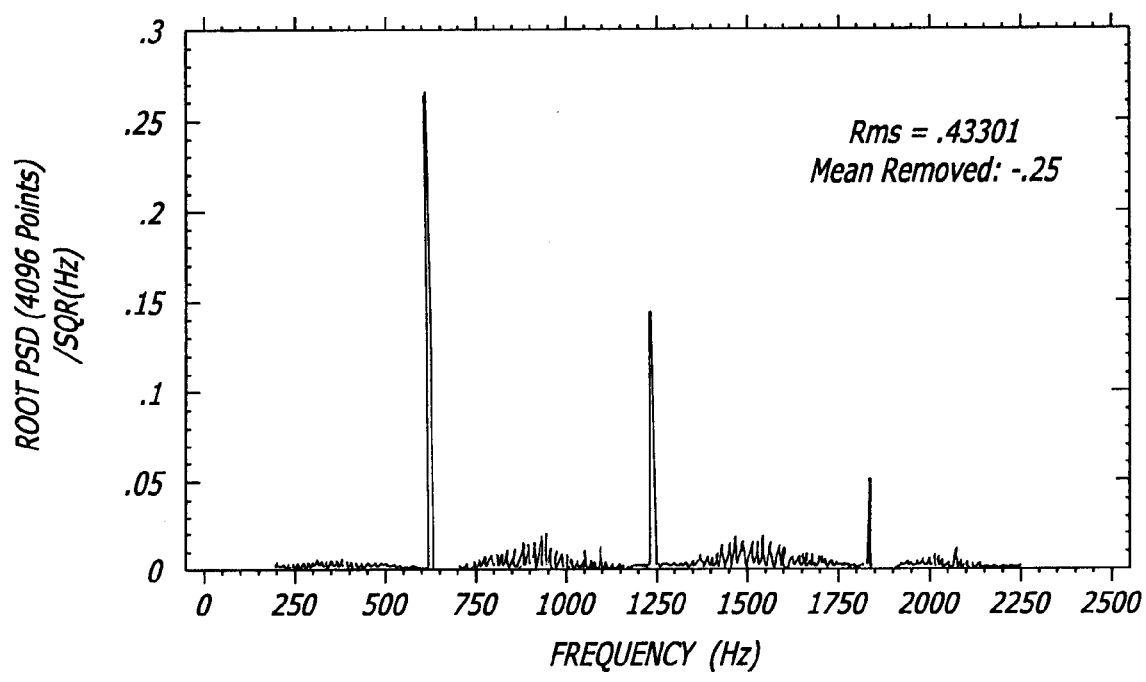

Referring to FIG. 4(b), a frequency domain graph of the periodic accelerometer output, the power spectral density of the output data is seen to obtain relative maxima at the following low frequencies: 625 Hz, 1250 Hz and 1825 Hz. Thus, the moding content of the output is not broadband, giving rise to the spurious appearance of signal rather than noise.

Figure 5:
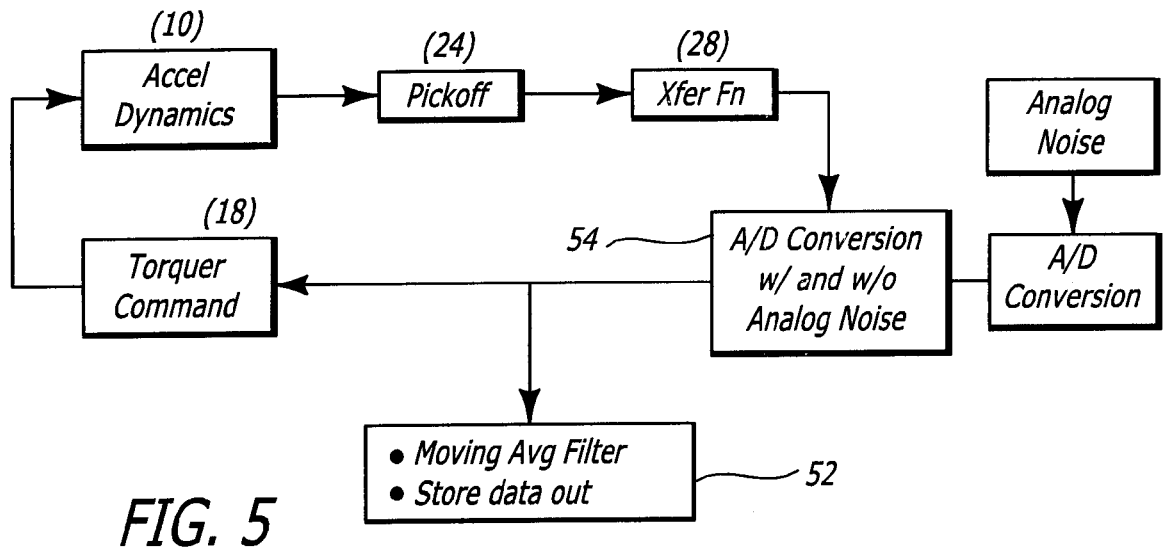
FIG. 5 is an operational model of a digitally rebalanced closed loop accelerometer in accordance with the invention.

FIG. 5 is an operational model of a digitally force rebalanced closed loop accelerometer in accordance with the invention. In contrast to the model of FIG. 3, a moving average filter 52 is provided off-line for receiving the output of the A/D conversion. As an additional departure from the prior art, the A/D conversion may be performed either with or without the addition of analog noise at 54.

Examining first the effect of the addition of analog noise, a simulation in accordance with the operational model of FIG. 5 was performed in response to an assumed acceleration force of 0.00825 g. The incorporation of analog noise into the analog signal (prior to A/D conversion) was simulated by the addition of a small random number. ITORQ, the digital output after A/D conversion, was calculated as:

$$\text{ITORQ} = \text{round}(\text{Pickoff}_{A/D} - \text{rnd}(\alpha))$$

where

ITORQ=torque duration (digital); integer value $\text{Pickoff}_{A/D}$=electrical measure of pickoff position (analog); real value rnd(($\alpha$)=random number uniformly distributed between ($-\alpha/2$, $+\alpha/2$)

round($\alpha$)=function that rounds a value to the nearest integer

For purposes of the simulation, the amount of noise defined above may be varied by limiting the range of the random numbers produced to make it less probable that ITORQ is altered. In this way, for any given value of $\text{Pickoff}_{A/D}$, rnd(0.1) has a lower probability of rounding ITORQ up an integer than rnd(0.5) would. That is:

$$\text{rnd}(0.1) \rightarrow \text{random number} \in (-0.05, 0.05)$$

$$\text{rnd}(0.5) \rightarrow \text{random number} \in (-0.25, 0.25)$$

Figure 6A:
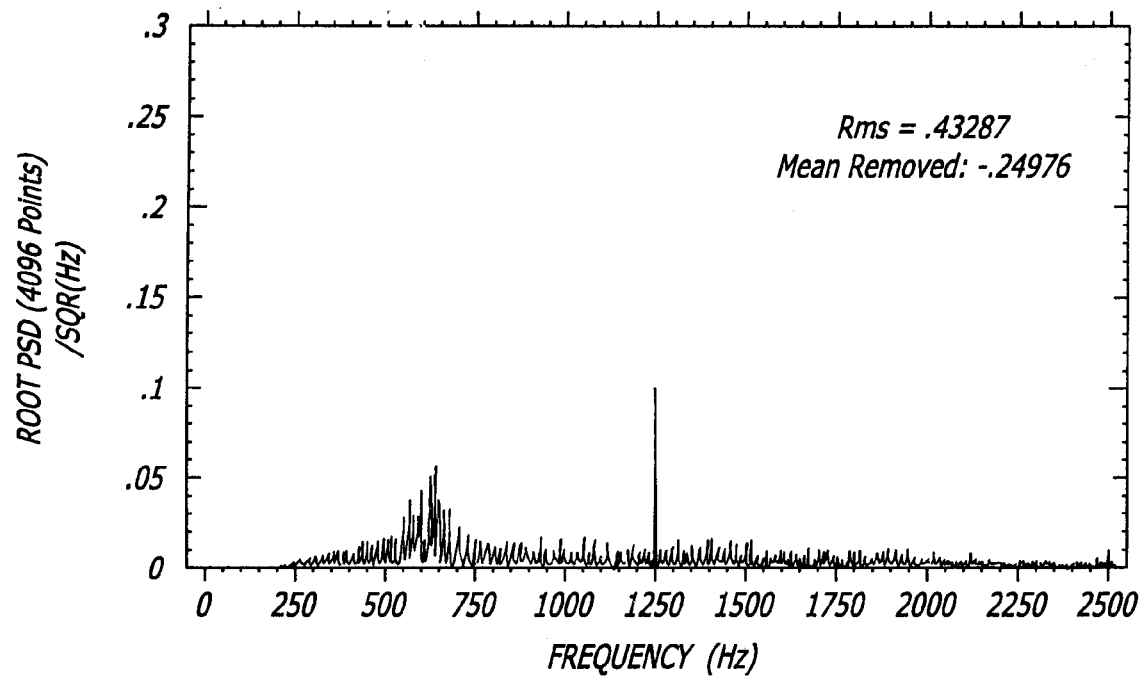
FIGS. 6(a) and 6(b) are frequency domain graphs for illustrating the outputs of simulations based upon the operational model of the invention with analog noise added prior to A/D conversion.
Figure 6B:
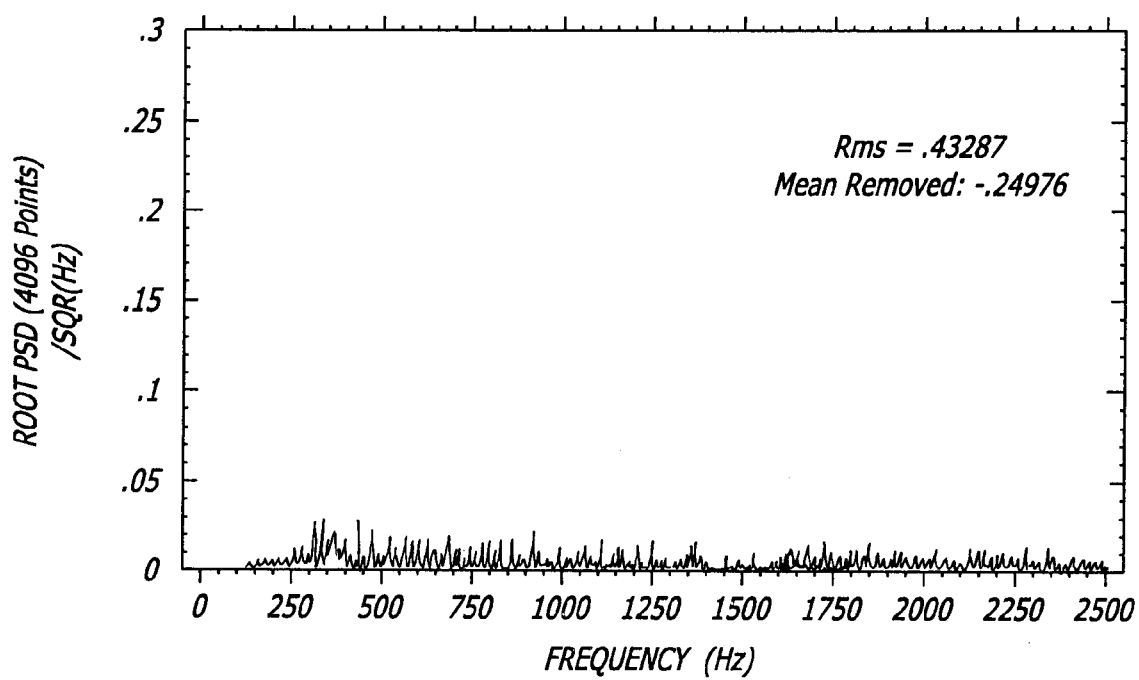

FIGS. 6(a) and 6(b) are frequency domain graphs for illustrating the outputs of simulations based upon the operational model of the invention with analog noise added prior to A/D conversion. The graph of FIG. 6(a) is based upon the analog signal being generated by rnd(0.1) while that of FIG. 6(b) is based upon rnd(0.5). When compared to the graph of FIG. 4(b), these simulations display a significant reduction in the periodic pattern that characterizes moding noise. While moding noise is not entirely eliminated (see for example, the significant content of the power spectrum at 1250 Hz in FIG. 6(a)), a significant reduction in periodic low frequency content clearly results from the addition of analog noise.

Figure 7:
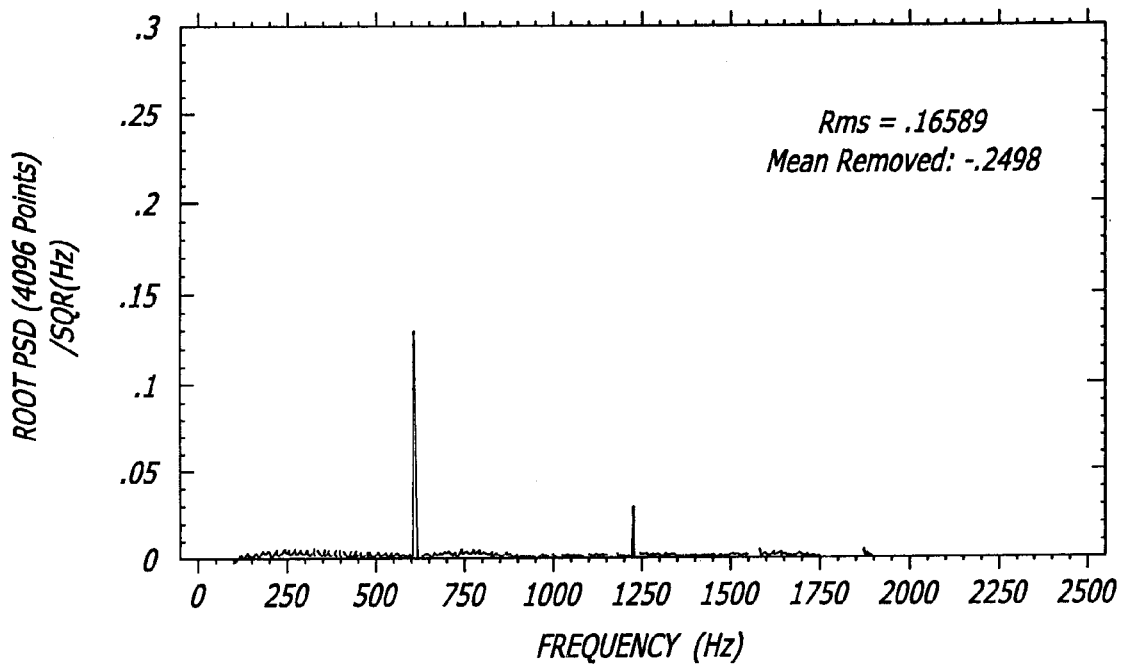
FIG. 7 is a frequency domain graph for illustrating the output of a simulation based upon the operational model of the invention with a five (5) point moving average filter.

FIG. 7 is a frequency domain graph for illustrating the output of a simulation based upon the operational model of the invention with the output of the A/D conversion (without the addition of analog noise) applied to a five (5) point moving average filter. As can be seen, the presence of periodic low frequency noise in the output of the accelerometer is again significantly reduced when compared to the response of a prior art force rebalanced accelerometer despite the presence of a significant component at 600 Hz.

Figure 8:
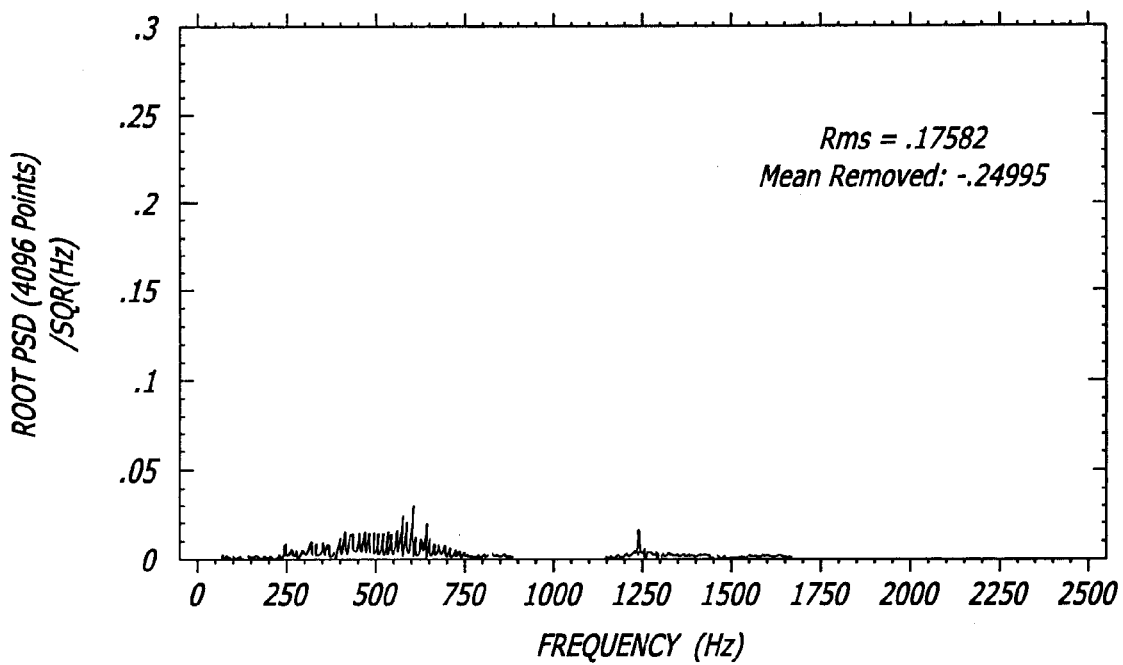
FIG. 8 is a frequency domain graph of the output of a simulation based upon the operational model of the invention employing both analog noise prior to A/D conversion and application of the output to a five (5) point moving average filter.

FIG. 8 is a frequency domain graph of the output of a simulation based upon the operational model of the invention employing both analog noise (prior to A/D conversion) and subsequent application of the digitized output to a five (5) point moving average filter. As in all of the simulations performed, a 0.00825 g acceleration force is assumed. As can be observed in FIG. 8, the combination of adding analog noise and applying the resultant digitized output to a moving average filter produces a dramatic reduction in the content of low frequency periodic patterns in the output.

Figure 9:
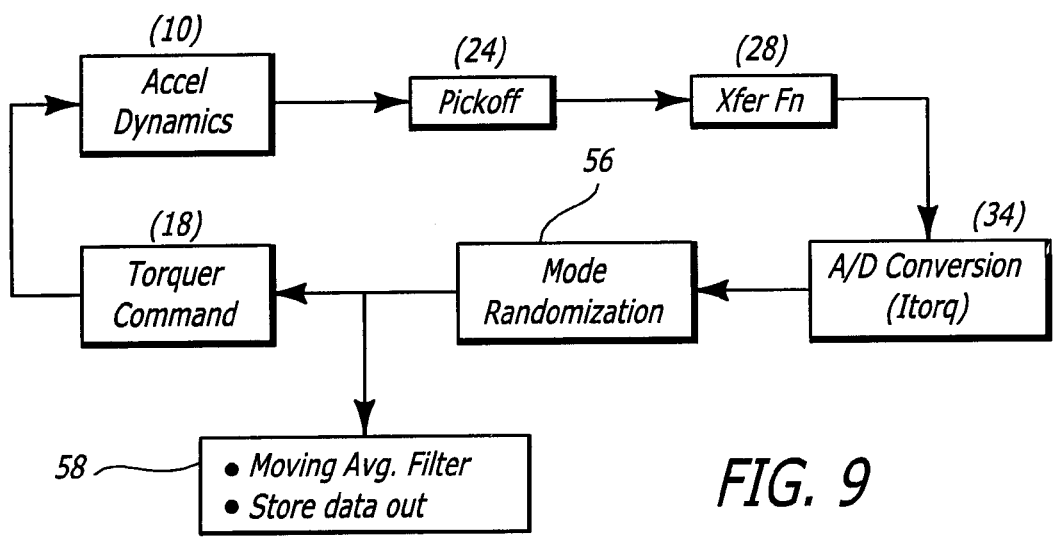
FIG. 9 is an operational model of a digitally rebalanced closed loop accelerometer in accordance with an alternative embodiment of the invention.

FIG. 9 is an operational model of a digitally rebalanced closed loop accelerometer in accordance with an alternative embodiment of the invention. The model of FIG. 9 differs from the prior art insofar as the output of the A/D conversion 34 is randomized within the feedback loop 56 and the randomized digitized output is then filtered by means of a moving average filter 58. While the randomized output is employed to drive the torque electrode, the filtered value is not. Moding randomization may occur in-line and without the use of a specific fixed pattern since it serves to modulate the torquer command. As in the case of the prior simulation of analog noise, such randomization has the effect of randomly changing the digitized ITORQ value by one bit.

Figure 10A:
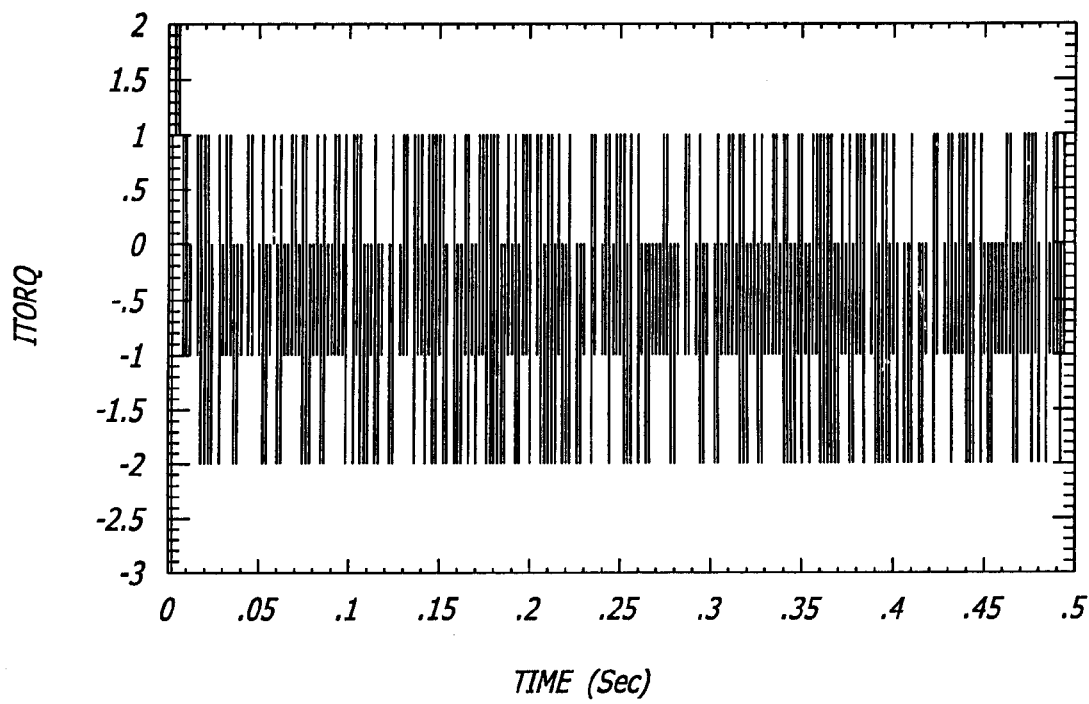
FIGS. 10(a) and 10(b) are time and frequency domain graphs, respectively, for illustrating the output of a simulation based upon the invention in accordance with FIG. 9 with mode randomization applied in-line to the output of the A/D conversion.
Figure 10B:
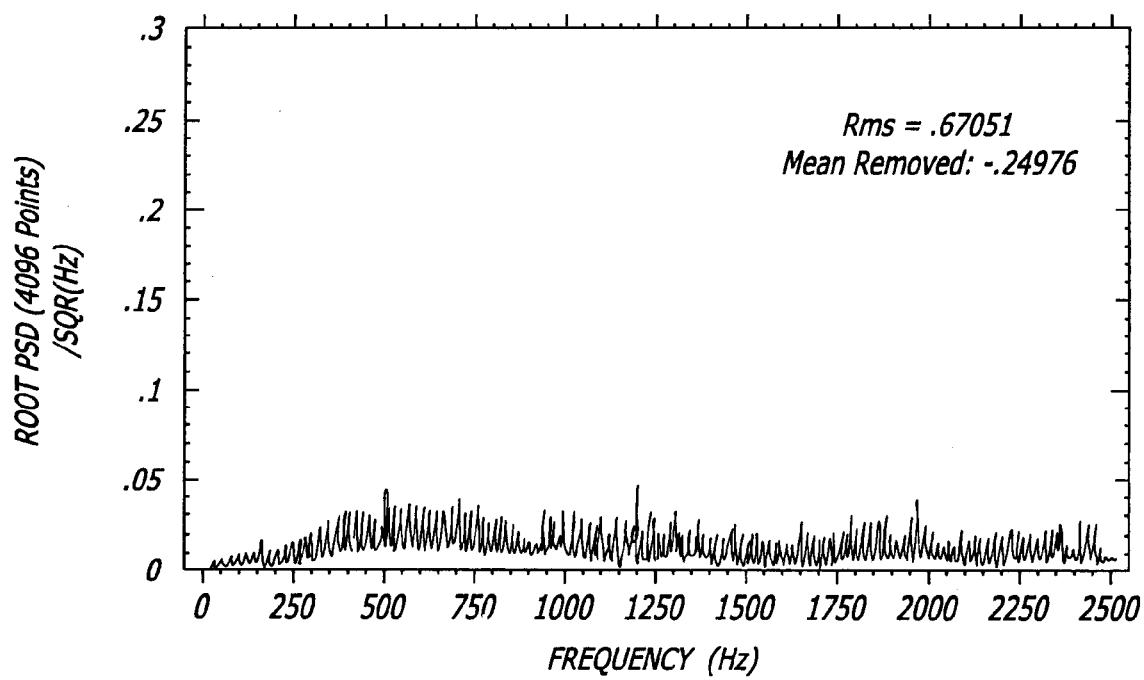

FIGS. 10(a) and 10(b) are time and frequency domain graphs for illustrating the output of a simulation based upon the operational model of the invention in accordance with FIG. 9 with the output taken after in-line randomization. Contrasting the time domain data of FIG. 10(a) with that of FIG. 4(a), one can see that, in contrast to the regular periodic pattern of FIG. 4(a) the graph of FIG. 10(a) comprises a signal of four distinct amplitude values (including opposite senses) with irregular spacings therebetween. This is borne out in the frequency domain graph of FIG. 10(b) which indicates that moding is suppressed without a large bias error at the expense of some increase in output noise.

Figure 11A:
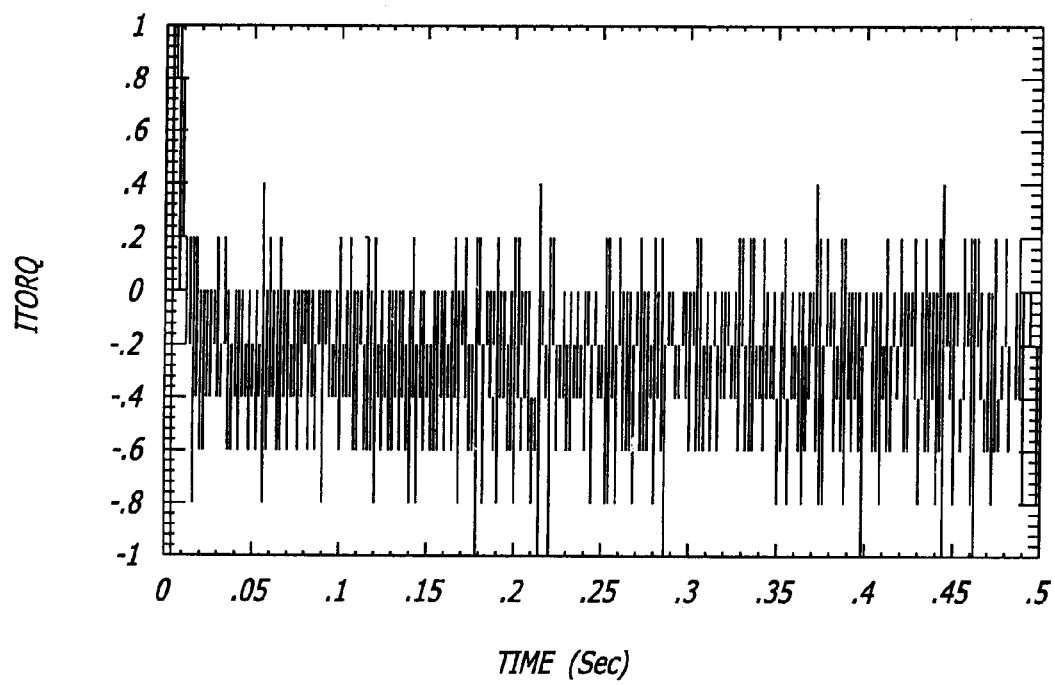
FIGS. 11(a) and 11(b) are time and frequency domain graphs, respectively, for illustrating the output of a simulation based upon the operational model of the invention in accordance with FIG. 9 in which the output is taken after both in-line randomization and off-line application to a five (5) point moving average filter.
Figure 11B:
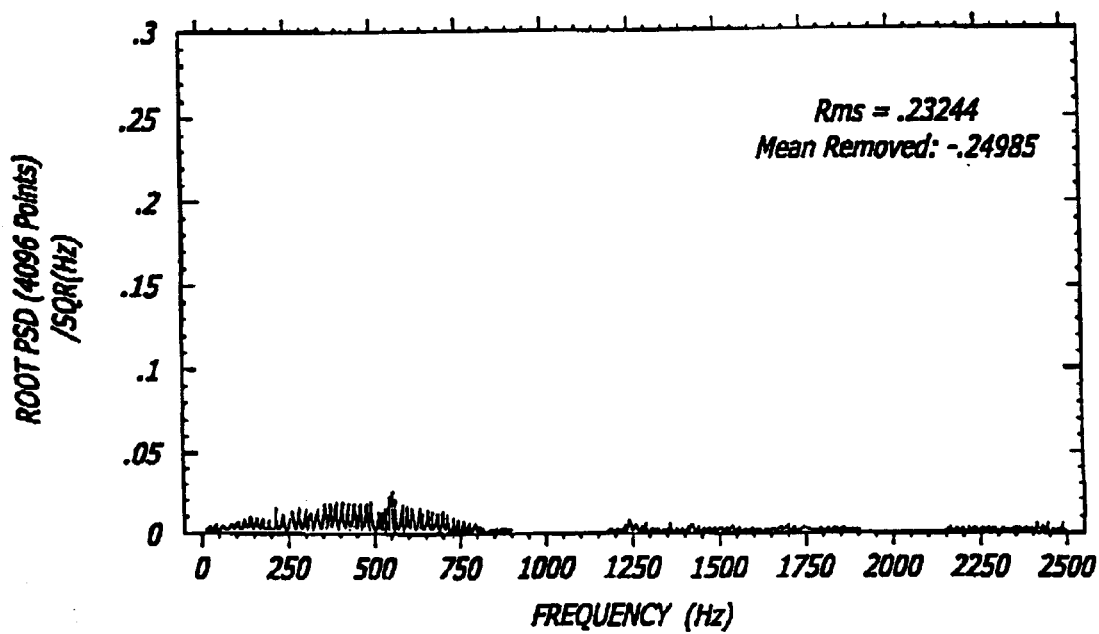

FIGS. 11(a) and 11(b) are time and frequency domain graphs of the output of a simulation based upon the operational model of the invention in accordance with FIG. 9 with the output taken after both in-line randomization and off-line application to a five (5) point moving average filter. As may be observed, the addition of off-line filtering of the randomized output reduces noise, especially at the higher frequencies, without introducing any appreciable moding.

Thus it is seen that the present invention provides both a method and apparatus for reducing the moding noise present in the output of a digitized force rebalanced accelerometer. By applying the teachings of this invention, one may be assured of an increased signal-to-noise ratio and other enhancements to accelerometer performance.

While the invention has been described with reference to its presently preferred embodiment, it is not limited thereto. Rather, this invention is limited only insofar as it is defined by the following set of patent claims and includes within its scope all equivalents thereof.

What is claimed is:

1. A method for reducing periodic low frequency noise in the output of a closed-loop force rebalanced accelerometer of the type in which an analog nulling signal is digitized to form an output signal for torquing a pendulous mass, said method comprising the steps of:
   a) receiving said digitized output signal; and then
   b) applying said received signal to a moving average filter.

2. A method as defined in claim 1 wherein said step of applying said digitized output signal includes the step of applying said digitized output signal to a five point moving average filter.

3. A method for reducing periodic low frequency noise in the output of a closed-loop force rebalanced accelerometer of the type in which a digital output signal for torquing a pendulous mass is derived from an analog nulling signal, said method comprising the steps of:
   a) adding analog noise to said analog nulling signal; and then
   b) digitizing said signal to form said output signal.

4. A method as defined in claim 3 further including the step of filtering said output signal.

5. A method as defined in claim 4 wherein the step of filtering additionally includes the step of applying said output signal to a moving average filter.

6. A method as defined in claim 5 further including the step of applying said output signal to a five point moving average filter.

7. A method for reducing periodic low frequency noise in the output of a closed-loop force rebalanced accelerometer of the type in which an analog nulling signal is digitized to form a signal that is fed back within said closed loop accelerometer, said method comprising the step of randomizing said digitized signal to form an output.

8. A method as defined in claim 7 wherein said randomized digitized signal is utilized for torquing a pendulous mass.

9. A method as defined in claim 8 further including the step of filtering said randomized digitized signal.

10. A method as defined in claim 9 wherein said filtering step is performed outside said closed loop accelerometer.

11. A method as defined in claim 10 wherein the step of filtering additionally includes the step of applying said randomized digitized signal to a moving average filter.

12. A method as defined in claim 11 wherein said moving average filter is a five point moving average filter.

13. A closed-loop force rebalanced accelerometer comprising, in combination:
   a) a pendulous mass;
   b) a nulling circuit for generating an analog signal responsive to displacement of said pendulous mass;
   c) a transfer function circuit for generating an analog nulling signal in response to a pickoff signal;
   d) an analog-to-digital conversion circuit for digitizing said nulling signal;
   e) a torquer circuit for driving said pendulous mass in response to said digitized nulling signal;
   f) a moving average filter for receiving said digitized nulling signal and generating an output in response thereto; and
   g) said filter being located outside said closed loop.

14. An accelerometer as defined in claim 13 wherein said moving average filter is a five point moving average filter.

15. A closed-loop force rebalanced accelerometer comprising, in combination;
   a) a pendulous mass;
   b) a pickoff circuit for generating an analog signal responsive to displacement of said pendulous mass;
   c) a transfer function circuit for generating an analog nulling signal in response to a pickoff signal;

d) an analog-to-digital conversion circuit for digitizing said nulling signal;
e) a torquer circuit for driving said pendulous mass in response to said digitized nulling signal; and
f) a circuit within a loop for adding analog noise to said nulling signal whereby said nulling signal including analog noise is digitized by said analog-to-digital conversion circuit.

16. A closed-loop force rebalanced accelerometer comprising, in combination;
a) a pendulous mass;
b) a pickoff circuit for generating an analog signal responsive to displacement of said pendulous mass;
c) a transfer function circuit for generating an analog nulling signal in response to a pickoff signal;
d) an analog-to-digital conversion circuit for digitizing said nulling signal;
e) a torquer circuit for driving said pendulous mass in response to said digitized nulling signal; and
f) a circuit for randomizing said digitized nulling signal.

17. A closed-loop force rebalanced accelerometer comprising, in combination:
a) a pendulous mass;
b) a nulling circuit for generating an analog signal responsive to displacement of said pendulous mass;
c) a transfer function circuit for generating an analog nulling signal in response to a pickoff signal;
d) an analog-to-digital conversion circuit for digitizing said nulling signal;
e) a torquer circuit for driving said pendulous mass in response to said digitized nulling signal;
f) a filter for receiving said digitized nulling signal and generating an output in response thereto;
g) said filter being located outside said closed loop; and
h) a circuit within a loop for adding analog noise to a rebalance signal whereby said rebalance signal including analog noise is digitized by said analog-to-digital conversion circuit.

18. A closed-loop force rebalanced accelerometer comprising, in combination:
a) a pendulous mass;
b) a nulling circuit for generating an analog signal responsive to displacement of said pendulous mass;
c) a transfer function circuit for generating an analog nulling signal in response to a pickoff signal;
d) an analog-to-digital conversion circuit for digitizing said nulling signal;
e) a torquer circuit for driving said pendulous mass in response to said digitized nulling signal;
f) a filter for receiving said digitized nulling signal and generating an output in response thereto;
g) said filter being located outside said closed loop;
h) a circuit for randomizing a digitized rebalance signal; and
i) an output of said circuit for randomizing a digitized rebalance signal being applied to said filter and to said torquer circuit.

* * * * *